(12) United States Patent
Hibbeler et al.

(10) Patent No.: US 8,405,751 B2
(45) Date of Patent: Mar. 26, 2013

(54) IMAGE SENSOR PIXEL STRUCTURE EMPLOYING A SHARED FLOATING DIFFUSION

(75) Inventors: Jason D. Hibbeler, Essex Junction, VT (US); Daniel N. Maynard, Essex Junction, VT (US); Kevin N. Ogg, Essex Junction, VT (US); Richard J. Rassel, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 659 days.

(21) Appl. No.: 12/534,427

(22) Filed: Aug. 3, 2009

(65) Prior Publication Data

US 2011/0025892 A1 Feb. 3, 2011

(51) Int. Cl.
*H04N 5/335* (2011.01)
(52) U.S. Cl. ...... 348/308; 348/294; 257/291; 250/208.1
(58) Field of Classification Search .................. 348/272, 348/281, 294, 302, 308; 257/231, 290–293, 257/297, 336; 438/48, 57, 58, 69, 462; 250/208.1, 250/208.6, 210, 214.1; 716/100; 358/482; 359/619
See application file for complete search history.

(56) References Cited

U.S. PATENT DOCUMENTS

| | | | | |
|---|---|---|---|---|
| 4,636,865 A | * | 1/1987 | Imai | 348/307 |
| 5,835,141 A | * | 11/1998 | Ackland et al. | 348/308 |
| 6,160,281 A | * | 12/2000 | Guidash | 257/292 |
| 6,352,869 B1 | * | 3/2002 | Guidash | 438/16 |
| 2004/0005729 A1 | * | 1/2004 | Abe et al. | 438/48 |
| 2006/0286708 A1 | | 12/2006 | Rhodes | |
| 2007/0158713 A1 | * | 7/2007 | Ohkawa | 257/292 |
| 2007/0215912 A1 | * | 9/2007 | Kido et al. | 257/257 |
| 2008/0106603 A1 | * | 5/2008 | Whitehead et al. | 348/207.1 |
| 2008/0203452 A1 | * | 8/2008 | Moon et al. | 257/292 |
| 2009/0140304 A1 | * | 6/2009 | Kudoh | 257/292 |
| 2010/0020209 A1 | * | 1/2010 | Kim | 348/294 |
| 2010/0025569 A1 | * | 2/2010 | Matsumoto et al. | 250/208.1 |

* cited by examiner

*Primary Examiner* — Tuan Ho
*Assistant Examiner* — Kent Wang
(74) *Attorney, Agent, or Firm* — Scully, Scott, Murphy & Presser, P.C.; Anthony J. Canale (57) ABSTRACT

A pixel structure for an image sensor includes a semiconductor material portion having a coplanar and contiguous semiconductor surface and including four photodiodes, four channel regions, and a common floating diffusion region. Each of the four channel regions is directly adjoined to one of the four photodiodes and the common floating diffusion region. The four photodiodes are located within four different quadrants as defined employing a vertical line passing through a point within the common floating diffusion region as a center axis. The common floating diffusion region, a reset gate transistor, a source follower transistor, and a row select transistor are located within four different quadrants as defined employing a vertical line passing through a point within one of the photodiodes as an axis.

16 Claims, 6 Drawing Sheets

IMAGE SENSOR PIXEL STRUCTURE EMPLOYING A SHARED FLOATING DIFFUSION

BACKGROUND

The present invention relates to semiconductor structures, and more particularly to semiconductor structures including an image sensor pixel employing a shared floating diffusion, methods of operating the same, and a design structure for the same.

An image sensor converts a visual image to digital data that may be represented as a picture. The image sensor includes an array of pixels, which are unit devices for the conversion of the visual image into digital data. Digital cameras and optical imaging devices employ an image sensor. Image sensors include charge-coupled devices (CCDs) or complementary metal oxide semiconductor (CMOS) sensors.

While CMOS image sensors have been more recently developed compared to CCDs, CMOS image sensors provide an advantage of lower power consumption, smaller size, and faster data processing than CCDs as well as direct digital output that is not available in CCDs. Also, CMOS image sensors have lower manufacturing cost compared with CCDs since many standard semiconductor manufacturing processes may be employed to manufacture CMOS image sensors. For these reasons, commercial employment of CMOS image sensors has been steadily increasing in recent years.

A key performance metric of a pixel of an image sensor is the level of the leakage current from photodiodes to the electrical ground in the substrate or to an adjacent semiconductor device. Such leakage current is known to be proportional to the length of the perimeter of a photodiode, i.e., the length of the interface between the photodiode and shallow trench isolation structures.

Another key performance metric of the pixel of the image sensor is the density of semiconductor devices on the surface of the substrate. Particularly, designs that employ dummy devices that occupy an area for the purpose of maintaining a uniform pattern factor during semiconductor processing does not fully utilize all available areas of the semiconductor substrate.

Yet another key performance metric of the pixel of the image sensor is the density of metal wiring, and particularly the first level metal wiring that is closest to the photodiodes, that blocks light that impinges onto the photodiodes. In general, the lesser the area occupied by metal wiring, the more the transmission of light from the top surface of dielectric layers above the semiconductor substrate to the photodiodes, and consequently, the greater the efficiency of the photodiodes.

BRIEF SUMMARY

In an embodiment of the present invention, a pixel structure for an image sensor includes a semiconductor material portion having a coplanar and contiguous semiconductor surface and including four photodiodes, four channel regions, and a common floating diffusion region. Each of the four channel regions is directly adjoined to one of the four photodiodes and the common floating diffusion region. The four photodiodes are located within four different quadrants as defined employing a vertical line passing through a point within the common floating diffusion region as a center axis. The common floating diffusion region, a reset gate transistor, a source follower transistor, and a row select transistor are located within four different quadrants as defined employing a vertical line passing through a point within one of the photodiodes as an axis. A first contiguous metal wiring structure overlies a portion of the common floating diffusion region, a source region of the reset gate transistor, and a gate electrode of the source follower transistor. A second contiguous metal wiring structure overlies a source region of the source follower transistor and a drain region of the row select transistor. The pixel structure provides a reduced boundary length between the four photodiodes and the shallow trench isolation region, a highly efficient use of the pixel area for semiconductor devices, and a reduced metal wiring area compared with prior art pixel structures.

According to an aspect of the present invention, an image sensor pixel structure is provided, which includes a semiconductor substrate including a shallow trench isolation structure and a semiconductor material portion, wherein the shallow trench isolation structure laterally encloses the semiconductor material portion, the semiconductor material portion has a contiguous semiconductor surface and includes four photodiodes, four channel regions, and a common floating diffusion region, the contiguous semiconductor surface extends over an entirety of the semiconductor material portion, each of the four channel regions is directly adjoined to one of the four photodiodes and the common floating diffusion region, the four photodiodes are located within four different quadrants as defined employing a first vertical line passing through a first point within the common floating diffusion region as a center axis, and the first vertical line is perpendicular to the contiguous semiconductor surface.

According to another aspect of the present invention, a method of operating a semiconductor circuit embodied in a semiconductor structure is provided. The method includes providing a semiconductor structure including an image sensor pixel described above, generating electrical charges in a first photodiode among the four photodiodes; and transferring electrical charges from the first photodiode to the common floating diffusion region, while a second photodiode, a third photodiode, and a fourth photodiode among the four photodiodes are electrically isolated from the common floating diffusion region.

According to yet another aspect of the present invention, a machine readable storage medium embodying a design structure is provided. The design structure includes first data representing a shallow trench isolation structure and second data representing a semiconductor material portion, wherein the second data includes third data that represents four photodiodes, fourth data that represents four channel regions, and fifth data that represents a common floating diffusion region, wherein the semiconductor material portion is laterally enclosed by the shallow trench isolation structure and has a contiguous semiconductor surface that extends over an entirety of the semiconductor material portion, each of the four channel regions is directly adjoined to one of the four photodiodes and the common floating diffusion region, the four photodiodes are located within four different quadrants as defined employing a first vertical line passing through a first point within the common floating diffusion region as a center axis, and the first vertical line is perpendicular to the contiguous semiconductor surface.

DETAILED DESCRIPTION

As stated above, the present invention relates to semiconductor structures including an image sensor pixel employing a shared floating diffusion, methods of operating the same, and a design structure for the same, which are now described in detail with accompanying figures. It is noted that like and corresponding elements mentioned herein and illustrated in the drawings are referred to by like reference numerals.

As defined herein, an "image sensor pixel" refers to a unit element of an image sensor that generates an electrical signal from an impinging optical signal.

As defined herein, an "image sensor pixel structure" is a physical structure that includes at least one image sensor pixel and optionally devices that manipulate an electrical signal from any of the at least one image sensor pixels.

As defined herein, a quadrant refers to a set of all points having a same sign for x-coordinates and having a same sign for y-coordinates in a three-dimensional Cartesian coordinate.

As defined herein, a first quadrant refers to a set of all points having a positive x-coordinate and a positive y-coordinate in a three-dimensional Cartesian coordinate system.

As defined herein, a second quadrant refers to a set of all points having a negative x-coordinate and a positive y-coordinate in a three-dimensional Cartesian coordinate system.

As defined herein, a third quadrant refers to a set of all points having a negative x-coordinate and a negative y-coordinate in a three-dimensional Cartesian coordinate system.

As defined herein, a first quadrant refers to a set of all points having a positive x-coordinate and a negative y-coordinate in a three-dimensional Cartesian coordinate system.

Figure 1:
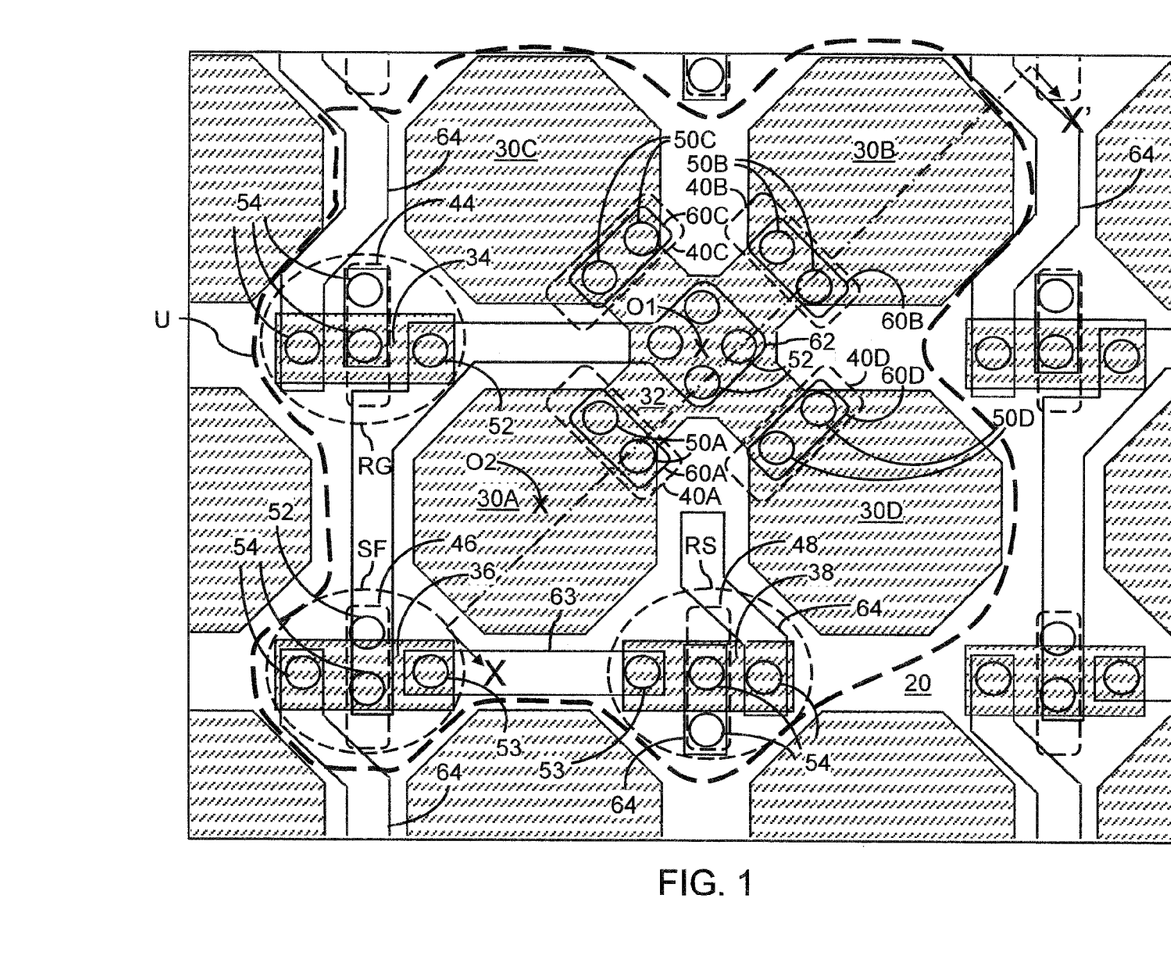
FIG. 1 is a see-through top-down view of an exemplary pixel array structure in which a unit cell U is repeated in a two-dimensional array according to an embodiment of the present invention.
Figure 2:
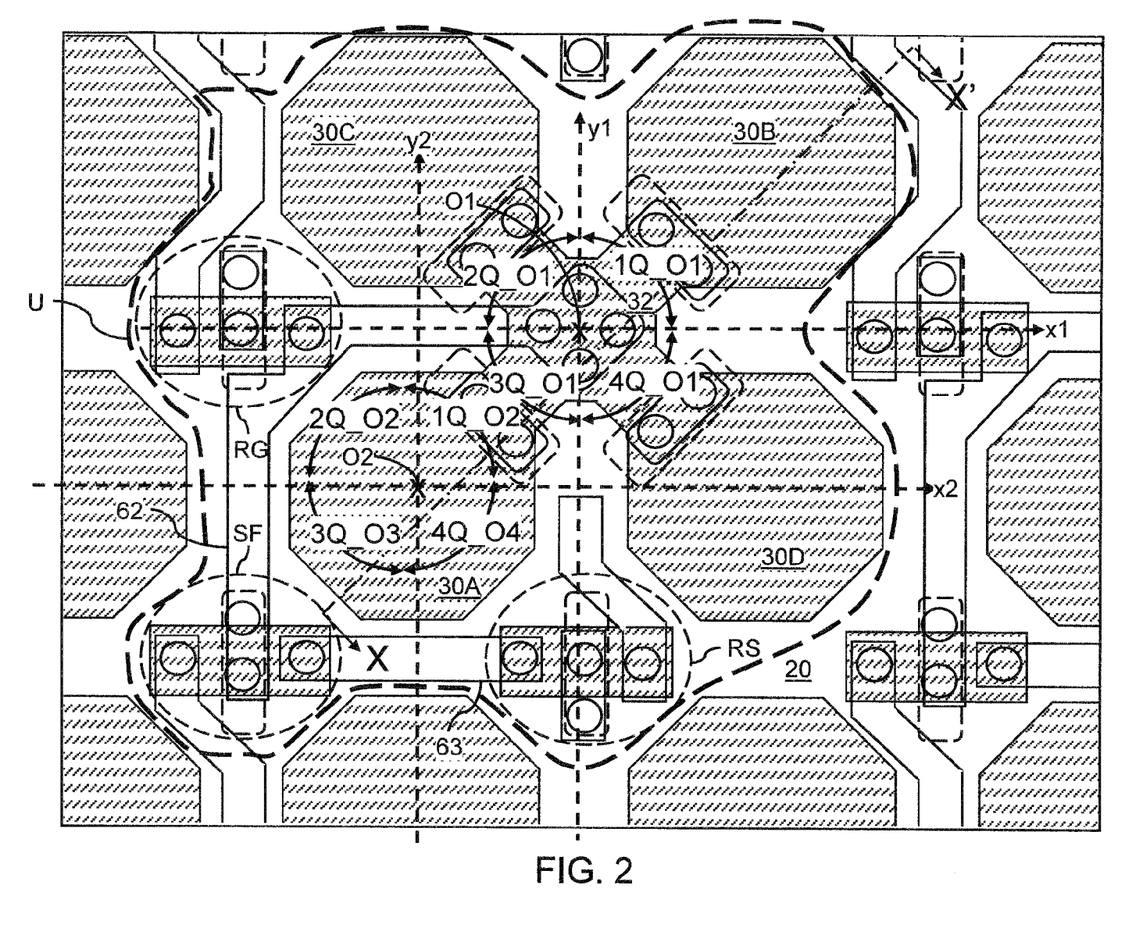
FIG. 2 is the see-through top-down view of FIG. 1, in which the four quadrants defined employing a first vertical line passing through a first point O1 within the common floating diffusion region as a center axis and the four quadrants as defined employing a second vertical line passing through a second point O2 within a first photodiodes as a center axis are shown according to an embodiment of the present invention.
Figure 3:
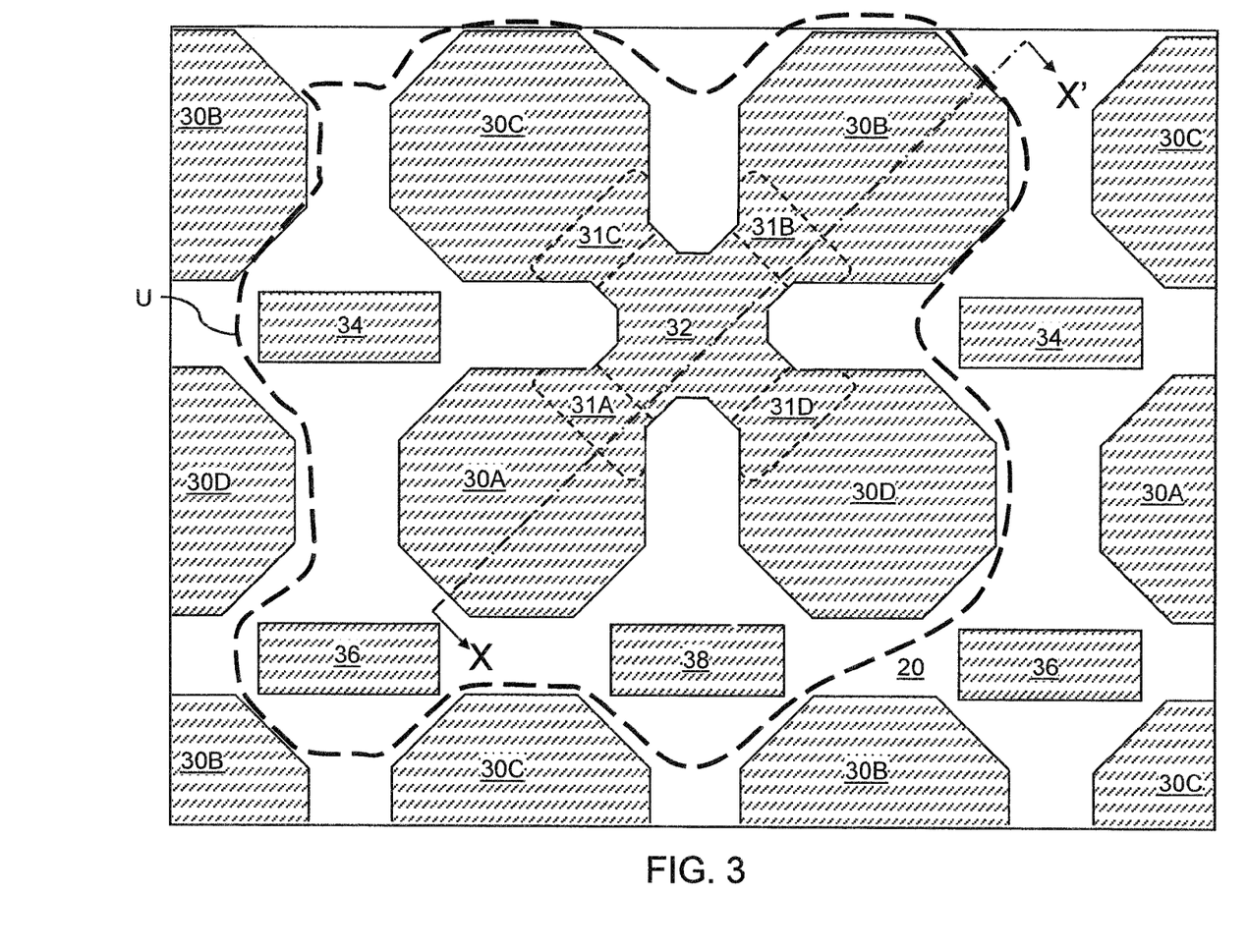
FIG. 3 is a top-down view of the exemplary pixel array structure in which all structures above the top surface of a semiconductor substrate 8 has been removed for clarity according to an embodiment of the present invention.
Figure 4:
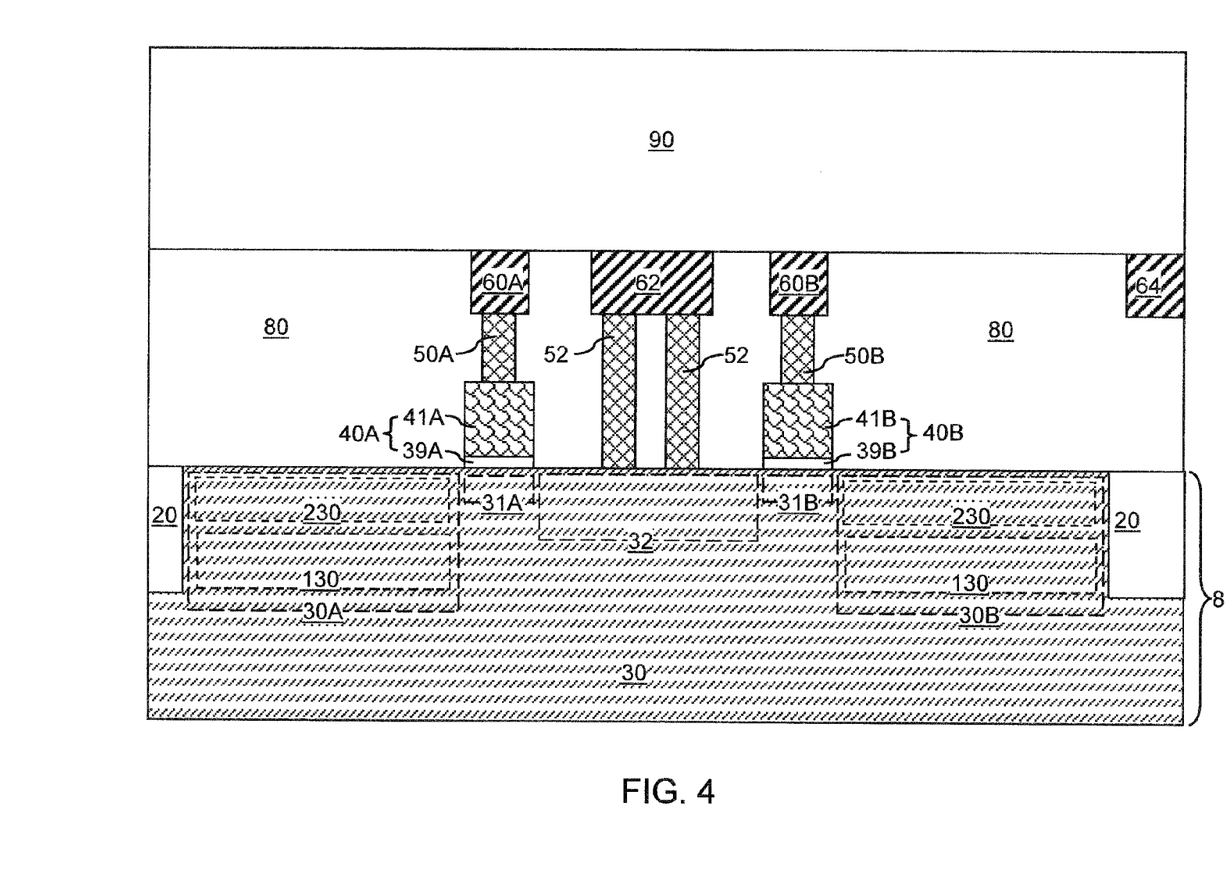
FIG. 4 is a vertical cross-sectional view of the exemplary pixel array structure of FIGS. 1-3 along the vertical plane X-X' according to an embodiment of the present invention.

Referring to FIGS. 1-4, an exemplary pixel array structure according to an embodiment of the present invention is shown. FIGS. 1 and 2 is a see-through top-down views in which a first optically-transparent dielectric layer 80 and a second optically-transparent dielectric layer 90 are not shown. In FIGS. 1 and 2, structures at a gate level are shown in dotted lines and structures in a first metal wiring level and structures in a contact via level are shown in solid lines. FIG. 3 is a top-down view of the exemplary pixel array structure in which all structures above the top surface of a semiconductor substrate 8 has been removed for clarity. FIG. 4 is a vertical cross-sectional view of the exemplary pixel array structure along the plane X-X' in FIGS. 1-3.

The exemplary pixel array structure includes a two-dimensional array of a unit cell U that is located on a semiconductor substrate 8. The unit cell U is an image sensor pixel structure, i.e., a physical structure that includes four image sensor pixels and devices that manipulate an electrical signal from the four image sensor pixels. The semiconductor substrate 8 includes a semiconductor material layer 30 and a shallow trench isolation structure 20 that extends from a top surface of the semiconductor material layer 30 to a depth into the semiconductor substrate 8. The semiconductor material layer 30 includes a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the entirety of the semiconductor material layer 30 is a single crystalline semiconductor material. For example, the entirety of the semiconductor material layer 30 may be a single crystalline silicon-containing material.

The shallow trench isolation structure 20 includes a dielectric material such as silicon oxide, silicon nitride, silicon oxynitride, or a combination thereof. Typically, the shallow trench isolation structure 20 laterally extends across the entire area of the exemplar pixel array structure and laterally encloses a plurality of semiconductor material portions. Within the unit cell U, for example, the shallow trench isolation structure 20 laterally encloses a first semiconductor material portion, a second semiconductor material portion 34, a third semiconductor material portion 36, and a fourth semiconductor material portion 38, all of which are portions of the semiconductor material layer 30.

The first semiconductor material portion including a first photodiode 30A, a second photodiode 30B, a third photodiode 30C, a fourth photodiode 30D, a first channel region 31A that underlies a first gate stack 40A, a second channel region 31B that underlies a second gate stack 40B, a third channel region 31C that underlies a third gate stack 40C, a fourth channel region 31D that underlies a fourth gate stack 40D, and a common floating diffusion region 32. The first semiconductor material portion (30A, 30B, 30C, 30D, 31A, 31B, 31C, 31D, 32) has a contiguous and coplanar semiconductor surface, which is a portion of a top surface of the semiconductor substrate 8. The contiguous and coplanar semiconductor surface of the first semiconductor material portion (30A, 30B, 30C, 30D, 31A, 31B, 31C, 31D, 32) extends over the entirety of the first semiconductor material portion (30A, 30B, 30C, 30D, 31A, 31B, 31C, 31D, 32). In other words, the entirety of the top surface of the first semiconductor material portion (30A, 30B, 30C, 30D, 31A, 31B, 31C, 31D, 32) is located within the same horizontal plane and the sidewalls of first semiconductor material portion (30A, 30B, 30C, 30D, 31A, 31B, 31C, 31D, 32) at an interface with the shallow trench isolation structure 20 is vertically coincident with the periphery of the contiguous and coplanar semiconductor surface of the first semiconductor material portion (30A, 30B, 30C, 30D, 31A, 31B, 31C, 31D, 32). The entirety of the first semiconductor material portion (30A, 30B, 30C, 30D, 31A, 31B, 31C, 31D, 32) is contiguous and has a periphery that laterally contacts the shallow trench isolation structure without a discontinuity.

Each of the four channel regions (31A, 31B, 31C, 31D) is directly adjoined to one of the four photodiodes (30A, 30B, 30C, 30D) and the common floating diffusion region 32. Specifically, the first channel region 31A is directly adjoined to the first photodiode 30A and the common floating diffusion region 32, the second channel region 31B is directly adjoined to the second photodiode 30B and the common floating diffusion region 32, the third channel region 31C is directly adjoined to the third photodiode 30C and the common floating diffusion region 32, and the fourth channel region 31D is directly adjoined to the fourth photodiode 30D and the common floating drain region 32.

Each of the first semiconductor material portion (30A, 30B, 30C, 30D, 31A, 31B, 31C, 31D, 32), the second semiconductor material portion 34, the third semiconductor material portion 36, and the fourth semiconductor material portion 38 does not directly contact any of other semiconductor portion, and is laterally separated by the shallow trench isolation region 20 from any other semiconductor portion.

Each of the four photodiodes (30A, 30B, 30C, 30D) in the unit cell U are located within four different quadrants as defined employing a first vertical line that passes through a first point O1 within the common floating diffusion region 32 as a center axis. The first vertical line is perpendicular to the contiguous semiconductor surface of the first semiconductor material portion (30A, 30B, 30C, 30D, 31A, 31B, 31C, 31D, 32), which is a portion of the top surface of the semiconductor substrate 8. The first point O1 may be located on the contiguous surface of the first semiconductor material portion (30A, 30B, 30C, 30D, 31A, 31B, 31C, 31D, 32).

For example, the first photodiode 30A may be located in a third quadrant 3Q_O1 of a first three-dimensional Cartesian coordinate system employing the first point O1 as the origin, the second photodiode 30B may be located in a first quadrant 1Q_O1 of the first three-dimensional Cartesian coordinate system, the third photodiode 30C may be located in a second quadrant 2Q_O1 of the first three-dimensional Cartesian coordinate system, and the fourth photodiode 30D may be located in a fourth quadrant 4Q_O1 of the first three-dimensional Cartesian coordinate system. The x-axis of the first three-dimensional coordinate system is labeled x1, and the y-axis of the first three-dimensional coordinate system is labeled y1.

Preferably, each of the four photodiodes (30A, 30B, 30C, 30D) has a horizontal cross-sectional area that is close to a convex polygon or a circle to minimize the interfacial area with the shallow trench isolation structure 20.

Each of the four photodiodes (30A, 30B, 30C, 30D) is a p-n junction photodiode, which includes a vertical stack of a first conductivity type semiconductor region 130 and a second conductivity type charge collection well 230. A second conductivity type charge collection well 230 is located directly underneath the top surface of a photodiode (30A, 30B, 30C, or 30D) and overlies a first conductivity type semiconductor region 130. The second conductivity type is the opposite of the first conductivity type. For example, if the first conductivity type is p-type, the second conductivity type is n-type, and vice versa. The first conductivity type semiconductor region 130 and the second conductivity type charge collection well 230 collectively constitute a photodiode (30A, 30B, 30C, or 30D) that generates electron-hole pairs. Charge carriers of the second conductivity type are collected in the second conductivity type charge collection well 230 in proportion to the amount of photons impinging into the photodiode (30A, 30B, 30C, or 30D). In case the first conductivity type is p-type and the second conductivity type is n-type, electrons are collected in the second conductivity type charge collection well 230. In case the second conductivity type is n-type and the second conductivity type is p-type, holes are collected in the second conductivity type charge collection well 230. A photon impinging on the photodiode (30A, 30B, 30C, or 30D) generates an electron-hole pair if the photon interacts with the semiconductor material in the photodiode (30A, 30B, 30C, or 30D). The energy of the photon that induces electron-hole pair generation depends on the type of the semiconductor material in the semiconductor material layer 30. For example, the wavelength range of photons for the photogeneration of an electron-hole pair is from 190 nm to 1,100 nm for silicon, from 400 nm to 1,700 nm for germanium, and from 800 nm to 2,600 nm for indium gallium arsenide, respectively.

If the electron-hole pair is generated within the depletion region of the photodiode (30A, 30B, 30C, or 30D), the charge carriers (holes and electrons) drift apart due to the kinetic energy imparted to the charge carriers during the photogeneration process. If a minority carrier (a charge carrier of the first conductivity type in the second conductivity type charge collection or a charge carrier of the second conductivity type in the first conductivity type semiconductor region 130 32) enters into the depletion region by drifting, the electric field inherent in the depletion region of the photodiode (30A, 30B, 30C, or 30D) sweeps the carrier across the p-n junction, which then becomes a majority carrier, i.e., a charge carrier of the first conductivity type in the first conductivity type semiconductor region 130 or a charge carrier of the second conductivity type in the second conductivity type charge collection well 230, upon crossing the p-n junction, and producing a photocurrent if the circuit is closed, or accumulates charges. Particularly, if the carrier is a carrier of the second conductivity type, the carrier accumulates in the second conductivity type charge collection well 230. The amount of charge that accumulates in the second conductivity type charge collection well 230 is nearly linear to the number of incident photons (assuming the photons have the same energy distribution). If the minority carrier recombines with the majority carriers within the photodiode prior to entering the depletion region, the minority carrier is "lost" through recombination and no current or charge accumulation results.

The exemplary image sensor pixel structure also includes transfer gate transistors that are employed to control the transfer of electrical charges from the four photodiodes (30A, 30B, 30C, 30D) to the common floating drain region 32. The four second conductivity type charge collection well 230, the four channel regions (31A, 31B, 31C, 31D), the common floating diffusion region 32, and four gate stacks (40A, 40B, 40C, 40D) constitute the four transfer gate transistors. The first gate stack 40A is a vertical stack of a first gate dielectric 39A and a first gate electrode 41A, the second gate stack 40B is a vertical stack of a second gate dielectric 39B and a second gate electrode 41B, the third gate stack 40C is a vertical stack of a third gate dielectric (not shown) and a third gate electrode (not shown), and the fourth gate stack 40D is a vertical stack of a fourth gate dielectric (not shown) and a fourth gate dielectric (not shown).

The first gate electrode 41A is contacted by first gate contact vias 50A, which contacts a bottom surface of a first gate metal line 60A. The second gate electrode 41B is contacted by second gate contact vias 50B, which contacts a bottom surface of a second gate metal line 60B. The third gate electrode (part of 40C, not separately labeled) is contacted by third gate contact vias 50C, which contacts a bottom surface of a third gate metal line 60C. The fourth gate electrode (part of 40D, not separately labeled) is contacted by fourth gate contact vias 50D, which contacts a bottom surface of a fourth gate metal line 60D. Each of the gate electrodes is electrically isolated from one another.

The first gate stack 40A, the first channel region 31A, the second conductivity type charge collection well 230 within the first photodiode 30A, and the common floating drain region 32 constitute the first transfer gate transistor (40A, 31A, 230, 32). The second gate stack 40B, the second channel region 31B, the second conductivity type charge collection well 230 within the second photodiode 30B, and the common floating drain region 32 constitute the second transfer gate transistor (40B, 31B, 230, 32). The third gate stack 40C, the third channel region 31C, the second conductivity type charge collection well 230 within the third photodiode 30C, and the common floating drain region 32 constitute the third transfer gate transistor (40C, 31C, 230, 32). The fourth gate stack 40C, the fourth channel region 31D, the second conductivity type charge collection well 230 within the fourth photodiode 30D, and the common floating drain region 32 constitute the fourth transfer gate transistor (40C, 31C, 230, 32).

The four gate stacks (40A, 40B, 40C, 40D) overlie the four channel regions (31A, 31B, 31C, 31D). The four photodiodes (30A, 30B, 30C, 30D), the four channel regions (31A, 31B, 31C, 31D), the common floating diffusion region 32, and the four gate stacks (40A, 40B, 40C, 40D) constitute four transfer gate transistors in a parallel connection between the common floating diffusion region 32 and electrical ground. The common floating diffusion region 32 constitutes a common drain that is shared among the four transfer gate transistors.

Preferably, each of the four gate electrodes of the four gate stacks (40A, 40B, 40C, 40D) is not resistively connected to any other of the four gate electrodes in the four gate stacks (40A, 40B, 40C, 40D). In other words, each gate electrode of the four gate stacks (40A, 40B, 40C, 40D) is an independent electrical node that is not directly connected to any other gate electrode of the four gate stacks (40A, 40B, 40C, 40D).

Each transfer gate transistor is integrally formed with the photodiode (30A, 30B, 30C, or 30D) such that the second conductivity type charge collection well 230, which comprises a doped second conductivity type semiconductor material, is also a source of the transfer gate transistor. Charge carriers of the second conductivity type, i.e., electrons if the second conductivity type is n-type or holes if the second conductivity type is p-type, accumulate in the second conductivity type charge collection when photons are incident on the photodiode (30A, 30B, 30C, or 30D). When the transfer gate transistor is turned on, the charge carriers in the second conductivity type charge collection are transferred into the floating drain 40, which is a charge collection well 230 and stores electrical charge from the photodiode (30A, 30B, 30C, or 30D) as data until a read circuit detects the amount of stored charge. Thus, the second conductivity type charge collection functions as the source of the transfer gate transistor while the transfer gate transistor is turned on.

The image sensor pixel structure in the unit cell U includes a reset gate transistor RG, a source follower transistor SF, and a row select transistor RS that are located on the semiconductor substrate 8. The source and drain regions and the channel of the reset gate transistor RG is located in the second semiconductor material portion 34. The source and drain regions and the channel of the source follower transistor SF are located in the third semiconductor material portion 36. The source and drain regions and the channel of the row select transistor RS are located in the fourth semiconductor material portion 38.

The common floating diffusion region 32, the reset gate transistor RS, the source follower transistor SF, and the row select transistor RS are located within four different quadrants as defined employing a second vertical line passing through a second point O2 within one of the four photodiodes as a center axis. The second vertical line is perpendicular to the contiguous semiconductor surface of the first semiconductor material portion (30A, 30B, 30C, 30D, 31A, 31B, 31C, 31D, 32), which is a portion of the top surface of the semiconductor substrate 8. The second point O2 may be located on the contiguous surface of the first semiconductor material portion (30A, 30B, 30C, 30D, 31A, 31B, 31C, 31D, 32).

Specifically, the common floating diffusion region 32 may be located in a first quadrant 1Q_O2 of a second three-dimensional Cartesian coordinate system employing the second point O3 as the origin, the reset gate transistor RG may be located in a second quadrant 2Q_O2 of the second three-dimensional Cartesian coordinate system, the source follower transistor SF may be located in a third quadrant 3Q_O2 of the second three-dimensional Cartesian coordinate system, and the row select transistor RS may be located in a fourth quadrant 4Q_O2 of the second three-dimensional Cartesian coordinate system. The x-axis of the second three-dimensional coordinate system is labeled x2, and the y-axis of the second three-dimensional coordinate system is labeled y2.

Preferably, the common floating diffusion region 32, the reset gate transistor RG, the source follower transistor SF, and the row select transistor RS are arranged in a clockwise direction or in an anticlockwise direction around one of the four photodiode (30A, 30B, 30C, or 30D). Thus, a quadrant as defined employing the second vertical line and including the common floating diffusion region 32, e.g., the first quadrant Q_O2 of a second three-dimensional Cartesian coordinate system, is located immediately adjacent to a quadrant as defined employing the second vertical line and including the reset gate transistor RS, e.g., the second quadrant 2Q_O2 of the second three-dimensional Cartesian coordinate system, and is located immediately adjacent to another quadrant as defined employing the second vertical line and including the row select transistor RS, e.g., the fourth quadrant 4Q_O2 of the second three-dimensional Cartesian coordinate system.

The image sensor pixel structure in the unit cell U also includes an overlying portion of a first optically-transparent dielectric layer 80 that embeds contiguous metal wiring structures, which provide resistive electrical connections among the common floating diffusion region 32, the reset gate transistor RG, the source follower transistor SF, and the row select transistor RS. Preferably, the contiguous metal wiring structures do not overlie any of the four photodiodes (30A, 30B, 30C, 30D) in order to maximize light transmission thereupon. At least another optically-transparent dielectric layer including a second optically-transparent dielectric layer 90 may overlie the first optically-transparent dielectric layer 80. The first and second optically-transparent dielectric layers (80, 90) includes a material that is optically transparent in the wavelength range that the four photodiodes (30A, 30B, 30C, 30D) are designed to detect. For example, the first and second optically-transparent dielectric layers (80, 90) may be silicon oxide layers.

The image sensor pixel structure in the unit cell U includes a first contiguous metal wiring structure 62 that overlies a portion of the common floating diffusion region 32, a source region of the reset gate transistor RS, and a gate electrode 46 of the source follower transistor SF. First contact vias 52 provide resistive electrical connections among the common floating diffusion region 32, the source region of the reset gate transistor RS, and a gate electrode 46 of the source follower transistor SF. Each of the first contact vias 52 vertically contacts the first contiguous metal wiring structure 62 and one of the common floating diffusion region 32, the source region of the reset gate transistor RG, and the gate electrode 46 of the source follower transistor SF.

The image sensor pixel structure in the unit cell U further includes a second contiguous metal wiring structure 63 that overlies a source region of the source follower transistor SF and a drain region of the row select transistor RS. Second contact vias 53 provide resistive electrical connections between the source region of the source follower transistor SF and the drain region of the row select transistor RS. Each of the second contact vias 53 vertically contacts the second contiguous metal wiring structure 63 and one of the source region of the source follower transistor SF and the drain region of the row select transistor RS.

Other contiguous metal wiring structures 64 and additional contact vias 54 provide resistive electrical connection between a drain region of the reset gate transistor RG and a drain region of the source follower transistor RG. The drain region of the reset gate transistor RG and the drain region of the source follower transistor RG may be connected to a power supply node. The other contiguous metal wiring structures 64 and the additional contact vias 54 may also be employed to provide electrical connections to the gate electrode 44 of the reset gate transistor GS, which is an input node that resets the reset gate transistor GS. In addition, the other contiguous metal wiring structures 64 and the additional contact vias 54 may also be employed to provide electrical connections to the gate electrode 48 of the row select transistor RS and a source region of the reset gate transistor RS, which is the output node of the image sensor pixel structure in the unit cell U.

Figure 5:
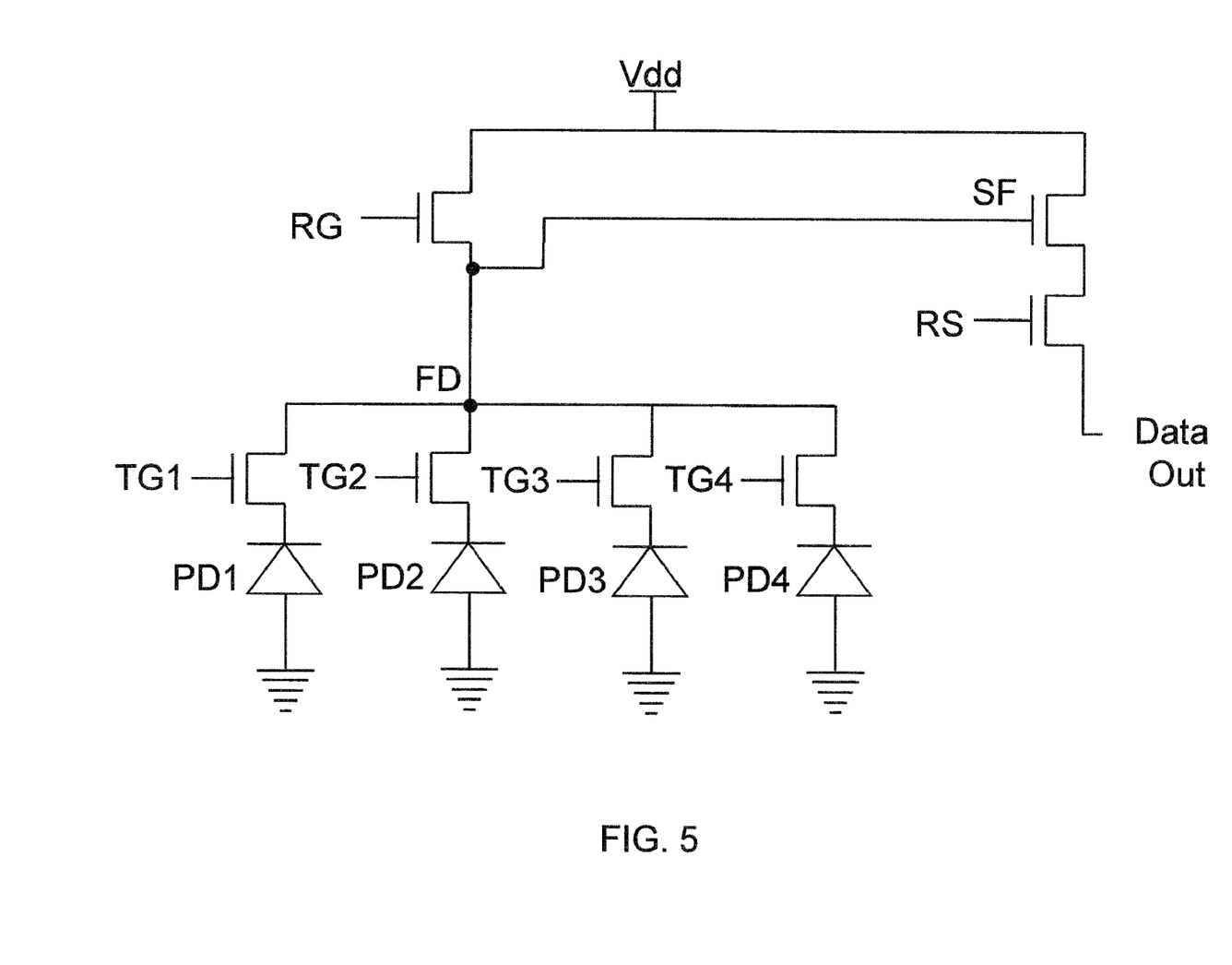
FIG. 5 is a circuit schematic of a unit cell U of the exemplary pixel array structure according to an embodiment of the present invention.

Referring to FIG. 5, is a circuit schematic of the unit cell U of the exemplary pixel array structure in FIGS. 1-4 is illustrated according to an embodiment of the present invention. The circuit schematic includes four photodiodes (PD1, PD2, PD3, PD4), four transfer gate transistors (TG1, TG2, TG3, TG4), a reset gate transistor RG, a source follower transistor SF, and a row select transistor RS. One end of each of the photodiodes (PD1, PD2, PD3, PD4) is grounded, while the other end of each of the photodiodes (PD1, PD2, PD3, PD4) is directly connected to a source of the transfer gate transistors (TG1, TG2, TG3, TG4). The common drain of the transfer gate transistors (TG1, TG2, TG3, TG4) is a floating diffusion node FD, which is electrically floating while the transfer gate transistors (TG1, TG2, TG3, TG4) and the reset gate transistor RS are turned off. The floating diffusion node FD is directly connected to the source of the reset gate transistor RG, which is herein referred to a reset gate transistor source, and to the gate of the source follower transistor SF, which is herein referred to the source follower transistor gate.

Each of the four photodiodes (PD1, PD2, PD3, PD4) is physically implemented as one of the four photodiodes (30A, 30B, 30C, 30D), respectively, in the unit cell U of the exemplary pixel array structure. Each of the four transfer gate transistors (TG1, TG2, TG3, TG4) is implemented as a transfer gate transistors including one of the four gate electrodes (40A, 40B, 40C, 40D) in the unit cell U of the exemplary pixel array structure. The floating diffusion node FD is implemented as the common floating drain 32 in the unit cell U of the exemplary pixel array structure. Each of the reset gate transistor RS, the source follower transistor SF, and the row select transistor RS in FIG. 5 is implemented as the reset gate transistor RS, the source follower transistor SF, and the row select transistor RS in FIGS. 1-3, respectively.

The source of the source follower transistor SF is directly connected to the drain of the row select transistor RS, which is herein referred to as a row select transistor drain. The source of the row select transistor RS, which is herein referred to as a row select transistor source, is a "data out" node, or the node at which the output of the image sensor pixel.

The drain of the reset gate transistor RG, which is herein referred to as a reset gate transistor drain, is directly connected to a system power supply voltage Vdd, which is typically a positive voltage. Further, the drain of the source follower transistor SF, which is herein referred to as a source follower transistor drain, is also directly connected to the system power supply voltage Vdd. The system power supply voltage Vdd herein refers to the power supply voltage employed for operation of general semiconductor circuit including the image sensor pixel in a normal operation mode.

During the operation of the circuit represented by the circuit schematic, electrical charges are generated in at least one photodiode among the four photodiodes (30A, 30B, 30C, 30D) in a unit cell U of the exemplary pixel array structure in FIGS. 1-4. Electrical charges are transferred from one of the photodiodes (30A, 30B, 30C, 30D) to the common floating diffusion region 32 by turning on one of the four transfer gate transistors (TG1, TG2, TG3, TG4), while the remaining three of the four transfer gate transistors (TG1, TG2, TG3, TG4) are electrically isolated from the common floating diffusion region 32 by remaining turned off.

The same operation may be performed on the remaining three of the four photodiodes (30A, 30B, 30C, 30D) and the remaining three of the four transfer gate transistors (TG1, TG2, TG3, TG4). Specifically, electrical charges may be generated in each of the remaining three of the four photodiodes (30A, 30B, 30C, 30D), and the electrical charges may be sequentially transferred from each of the remaining three of the four photodiodes (30A, 30B, 30C, 30D) to the common floating diffusion region 32. Three of the four photodiodes are electrically isolated by keeping the three corresponding transfer gate transistors turned off during each charge transfer into the common floating diffusion region 32.

Typically, the reset gate transistor RS is turned on and turned off prior to each transferring of electrical charges into the common floating diffusion region 32 to empty, or to reset, the charge in the common floating diffusion region 32. After each transferring of electrical charges into the common floating diffusion region 32, a voltage level at a source region of the row select transistor RS is determined, which is the output of the circuit that represents the amount of charge generated in one of the four photodiodes (30A, 30B, 30C, 30D).

The circuit may be employed in an array configuration to form an array of image sensors that captures an image. Such an array of image sensors may be employed in any optical, infrared, or ultraviolet imaging device including digital cameras. Typically, the operation of the array of the image sensors includes an exposure sequence and a readout sequence.

Figure 6:
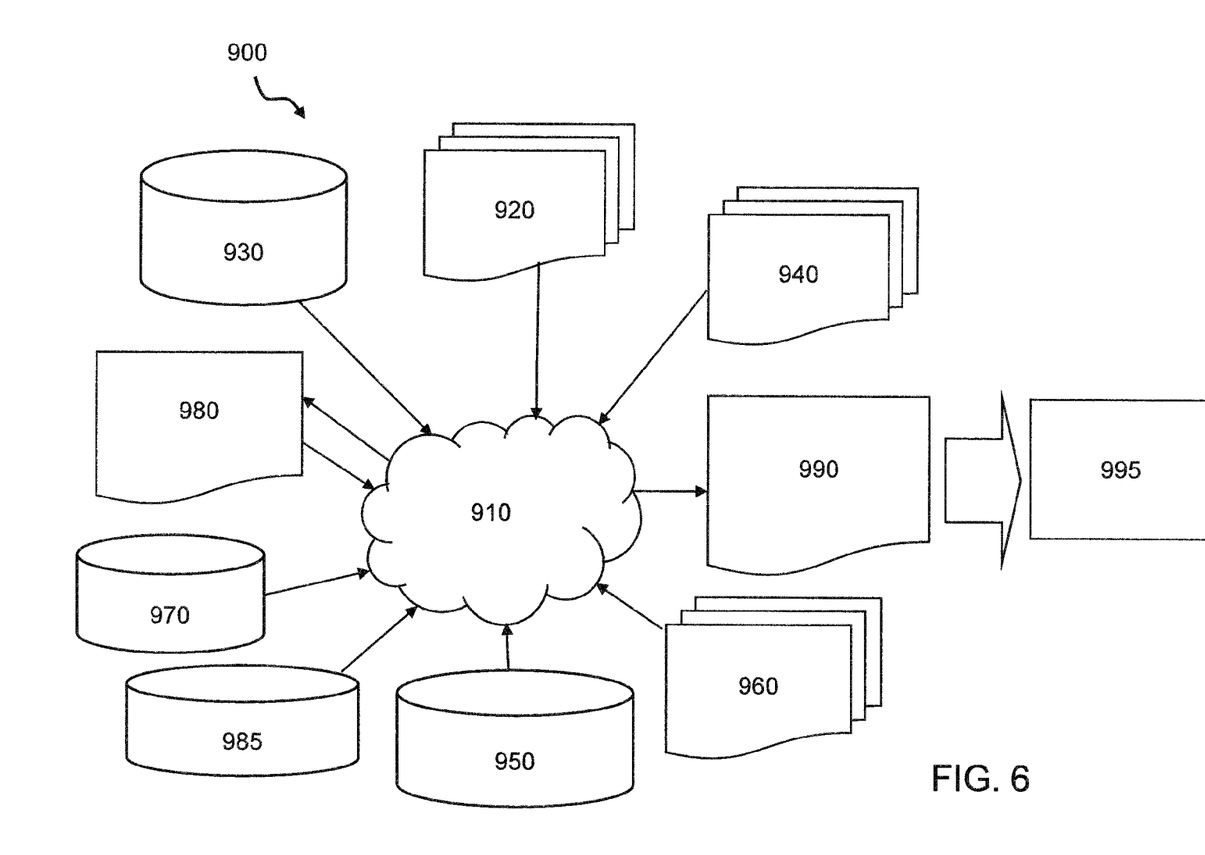
FIG. 6 is a flow diagram of a design process used in semiconductor design and manufacture of the semiconductor circuits according to an embodiment of the present invention.

FIG. 6 shows a block diagram of an exemplary design flow 900 used for example, in semiconductor design and manufacturing of the semiconductor circuit according to the present invention. Design flow 900 may vary depending on the type of integrated circuit (IC) being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 comprises an embodiment of present invention as shown in any of FIGS. 1-5 in the form of schematics or hardware description language (HDL; e.g., Verilog, VHDL, C, etc.) The design structure 920 may be contained on one or more machine readable medium. For example, design structure 920 may be a text file or a graphical representation of an embodiment of the invention as shown in FIGS. 1-5.

A machine readable storage medium embodying a design structure may be provided. For example, the design structure may include first data representing a shallow trench isolation structure and second data representing a semiconductor material portion. The second data may include third data that represents four photodiodes, fourth data that represents four channel regions, and fifth data that represents a common floating diffusion region. The design structure may further includes sixth data representing a reset gate transistor located on a semiconductor substrate, seventh data representing a source follower transistor located on the semiconductor substrate, eighth data representing a row select transistor that are located on the semiconductor substrate, ninth data representing a first contiguous metal wiring structure that overlies a portion of the common floating diffusion region, a source region of the reset gate transistor, and a gate electrode of the source follower transistor, tenth data representing a second contiguous metal wiring structure that overlies a source region of the source follower transistor and a drain region of the row select transistor, eleventh data representing four gate stacks overlying each of the four channel regions. A physical structure represented by each of the data may be the physical structures described above.

Design process 910 preferably synthesizes (or translates) an embodiment of the invention as show in FIGS. 1-5 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIGS. 1-5, along with any additional integrated circuit deign or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing though the manufacturing line, and any other data required by a semiconductor manufacturer to produce one of the embodiments of the present invention as shown in FIGS. 1-5. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. An image sensor pixel structure comprising:
a semiconductor substrate including a shallow trench isolation structure and a semiconductor material portion, wherein said shallow trench isolation structure laterally encloses said semiconductor material portion, said semiconductor material portion has a contiguous semiconductor surface and includes four photodiodes, four channel regions, and a common floating diffusion region, said contiguous semiconductor surface extends over an entirety of said semiconductor material portion, each of said four channel regions is directly adjoined to one of said four photodiodes and to said common floating diffusion region; and
four gate stacks overlying each of said four channel regions, wherein each of said four gate stacks includes a gate dielectric and a gate electrode, and wherein said four photodiodes, said four channel regions, said common floating diffusion region, and said four gate stacks constitute four field effect transistors in which said common floating diffusion region constitutes a common drain.

2. The image sensor pixel structure of claim 1, wherein said four photodiodes are located within four different quadrants as defined employing a first vertical line passing through a first point within said common floating diffusion region as a center axis, and said first vertical line is perpendicular to said contiguous semiconductor surface.

3. The image sensor pixel structure of claim 2, further comprising a reset gate transistor, a source follower transistor, and a row select transistor that are located on said semiconductor substrate, wherein said common floating diffusion region, said reset gate transistor, said source follower transistor, and said row select transistor are located within four different quadrants as defined employing a second vertical line passing through a second point within one of said four photodiodes as a center axis, and said second vertical line is perpendicular to said contiguous semiconductor surface.

4. The image sensor pixel structure of claim 3, further comprising a contiguous metal wiring structure and contact vias that resistively connect a drain region of said reset gate transistor and a drain region of another source follower transistor.

5. The image sensor pixel structure of claim 3, further comprising a first contiguous metal wiring structure that overlies a portion of said common floating diffusion region, a source region of said reset gate transistor, and a gate electrode of said source follower transistor, wherein said first contiguous metal wiring structure provides a path for a resistive electrical connection between said common floating diffusion region and a source region of said reset gate transistor.

6. The image sensor pixel structure of claim 5, further comprising first contact vias, wherein each of said first contact vias vertically contacts said first contiguous metal wiring structure and one of said common floating diffusion region, said source region of said reset gate transistor, and said gate electrode of said source follower transistor.

7. The image sensor pixel structure of claim 5, further comprising a second contiguous metal wiring structure that overlies a source region of said source follower transistor and a drain region of said row select transistor.

8. The image sensor pixel structure of claim 7, further comprising second contact vias, wherein each of said second contact vias vertically contacts said second contiguous metal wiring structure and one of said source region of said source follower transistor and said drain region of said row select transistor.

9. The image sensor pixel structure of claim 7, further comprising another contiguous metal wiring structure and additional contact vias that resistively connect a drain region of said reset gate transistor and a drain region of another source follower transistor.

10. The image sensor pixel structure of claim 3, wherein a quadrant as defined employing said second vertical line and including said common floating diffusion region is located immediately adjacent to a quadrant as defined employing said second vertical line and including said reset gate transistor and is located immediately adjacent to another quadrant as defined employing said second vertical line and including said row select transistor.

11. The image sensor pixel structure of claim 3, further comprising:
   a first optically-transparent dielectric layer embedding at least one contiguous metal wiring structure that provides resistive electrical connections among said common floating diffusion region, said reset gate transistor, said source follower transistor, and said row select transistor, wherein said at least one contiguous metal wiring structure does not overlie any of said four photodiodes; and
   at least another optically-transparent dielectric layer overlying said first dielectric layer.

12. The image sensor pixel structure of claim 1, wherein each of said four gate electrodes is not resistively connected to any other of said four gate electrodes.

13. The image sensor pixel structure of claim 1, wherein an entirety of said semiconductor material portion is a single crystalline silicon-containing material.

14. A method of operating a semiconductor circuit embodied in a semiconductor structure, said method comprising:
   providing a semiconductor structure including an image sensor pixel structure of claim 1;
   generating electrical charges in a first photodiode among said four photodiodes; and
   transferring electrical charges from said first photodiode to said common floating diffusion region, while a second photodiode, a third photodiode, and a fourth photodiode among said four photodiodes are electrically isolated from said common floating diffusion region.

15. The method of claim 14, further comprising:
   generating electrical charges in each of said second photodiode, said third photodiode, and said fourth photodiode; and
   sequentially transferring electrical charges from each of said second photodiode, said third photodiode, and said fourth photodiode to said common floating diffusion region, wherein three of said four photodiodes are electrically isolated during each charge transfer into said common floating diffusion region.

16. The method of claim 15, wherein said image sensor pixel structure further comprises a reset gate transistor, a source follower transistor, and a row select transistor that are located on said semiconductor substrate, wherein said common floating diffusion region, said reset gate transistor, said source follower transistor, and said row select transistor are located within four different quadrants as defined employing a second vertical line passing through a second point within one of said four photodiodes as a center axis, and said second vertical line is perpendicular to said contiguous semiconductor surface, and wherein said method further comprises:
   turning on and turning off said reset gate transistor prior to each transferring of electrical charges into said common floating diffusion region; and
   determining a voltage level at a source region of said row select transistor after each transferring of electrical charges into said common floating diffusion region.

* * * * *